United States Patent [19]

Vladik

[11] 3,877,065

[45] Apr. 8, 1975

[54] SEMICONDUCTOR ARRANGEMENT

[75] Inventor: Liboslav Vladik, Nurnberg, Germany

[73] Assignee: Semikron Gesellschaft fur Gleichrichterbau u. Elektronik m.b.H., Nurnberg, Germany

[22] Filed: July 30, 1973

[21] Appl. No.: 383,562

[30] Foreign Application Priority Data

July 29, 1972 Germany ........................... 2237366

[52] U.S. Cl. ...................... 357/80; 357/68; 357/70; 357/72

[51] Int. Cl. ............................................. H01l 5/00

[58] Field of Search ..................................... 317/234

[56] References Cited

UNITED STATES PATENTS

| | | | |
|---|---|---|---|
| 3,560,813 | 2/1971 | Phy | 317/234 |
| 3,568,036 | 3/1971 | Rosenberg | 321/15 |
| 3,715,802 | 2/1973 | Suenaga et al. | 317/234 |
| 3,739,438 | 6/1973 | Lambrecht | 29/25.42 |

*Primary Examiner*—Michael J. Lynch
*Assistant Examiner*—E. Wojciechowicz
*Attorney, Agent, or Firm*—Spencer & Kaye

[57] ABSTRACT

A semiconductor arrangement including a carrier plate which is provided with a slit-shaped recess for receiving the semiconductor wafer. The semiconductor wafer has a solderable contact electrode on each of its major surfaces and an elastic protective lacquer coating around its peripheral surface. The semiconductor wafer is arranged within the recess such that its major surface intersects the plane of the carrier plate and the protective coating of the semiconductor wafer contacts the end surfaces of the recess so as to hold the semiconductor wafer in place. Metal contacts which lie along the planar surface of the carrier plate and border the longitudinal edges of the recess connect the semiconductor wafer in a desired electrical arrangement.

9 Claims, 4 Drawing Figures

SEMICONDUCTOR ARRANGEMENT

BACKGROUND OF THE INVENTION

The present invention relates to a semiconductor arrangement in which one or a plurality of semiconductor wafers are arranged in corresponding recesses in a carrier plate and are interconnected to form the desired electrical circuit via metal contact paths provided on the carrier plate.

Semiconductor rectifier arrangements are known in which semiconductor devices are inserted in perforations in a carrier plate. The semiconductor devices are electrically interconnected by pieces of wire which are soldered to their exposed contact electrodes. The final structure including the carrier plate and the contacted semiconductor devices is provided with a protective and insulating coating of a synthetic material.

In such known arrangements, it is necessary to take special steps to secure the semiconductor devices within the perforations in order to be able to provide the contact arrangement in an economical manner. These specially required steps appear to constitute a significant drawback. Furthermore, the covering of all of the sides of the semiconductor device with the synthetic material does not always assure sufficient dissipation of the heat produced in the individual devices during operation.

Semiconductor arrangements are also known, especially, for example, high voltage rectifier arrangements, in which planar diodes are inserted into appropriate recesses within a carrier body of a thermally well conducting insulating material. The diodes are interconnected via metal contact bars, which form the conductive paths.

The manufacturing of such planar diode devices is complicated. Additionally, since the physical laws with the structure of the planar diodes result in a relatively low inverse voltage carrying capability for the individual elements, it is always necessary to have a much higher number of individual elements per arrangement as compared to the conventional high voltage rectifier embodiments. Consequently, it is not always possible to economically produce such planar diode devices.

SUMMARY OF THE INVENTION

An object of the present invention is therefore to provide a semiconductor arrangement including at least one semiconductor wafer which is supported by a carrier plate, in which the drawbacks of the known embodiments discussed above are avoided.

Another object of the present invention is to provide such a semiconductor arrangement which provides a surprisingly simple structure for an economical manufacture of rectifier arrangements in a predetermined connection by components which can be economically manufactured.

These objectives are accomplished according to the present invention in that the carrier plate is provided with at least one slit-type recess for accommodating a corresponding semiconductor wafer. The semiconductor wafer is provided at each of its major surfaces with a solderable contact electrode and at its peripheral surface with a surrounding elastic protective lacquer coating suitable for stabilizing the peripheral surface. The semiconductor wafer is inserted into the slit-type recess in a radial direction, such that its major surfaces intersect the plane of the carrier plate, and is fixed at the frontal faces of the recesses with the aid of the elastic protective lacquer coating. Metal contacts which lie along the carrier plate and border the longitudinal edges of the recesses connect the semiconductor wafer in the desired electrical circuit.

DESCRIPTION OF THE PREFERRED EMBODIMENTS

Figure 1:
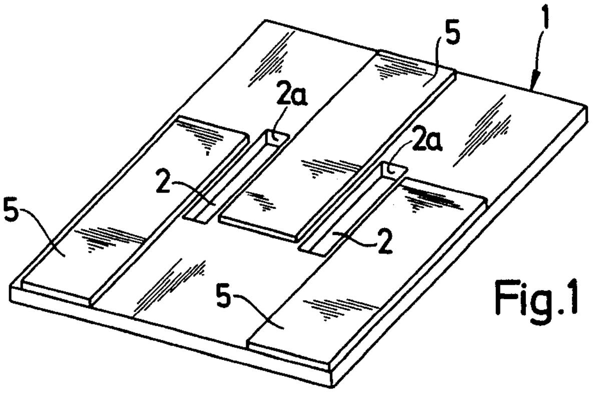
FIG. 1 is a perspective view of one embodiment of a carrier plate with the corresponding recesses and metal contacts in accordance with the present invention.
Figure 2:
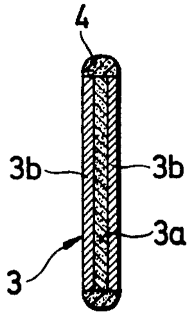
FIG. 2 is a sectional view of a semiconductor wafer in accordance with the present invention.

As shown in FIG. 1, the plate-shaped carrier body 1, which will be referred to as a carrier plate below, is provided with slit-type recesses 2, which are continuous, i.e. the recesses extend through the plate 1. A semiconductor wafer 3, which is specially constructed, as shown in FIG. 2, is inserted within each of the recesses 2 with its major surfaces and hence its contact surfaces being perpendicular to the plane of the carrier plate. The length of recesses 2 may correspond to the diameter of the semiconductor wafers, but the recesses are dimensioned in any case so that the inserted semiconductor wafer is fixed in the corresponding recess by a force fit. The structure of the semiconductor wafer will be further described below.

Along the longitudinal portions of carrier plate 1 between the recesses, which sides would be opposite the contact electrodes of the inserted semiconductor wafers, the carrier plate 1 is provided on at least one of its planar surfaces with metallization layers 5 which form metal contacts for interconnecting the semiconductor wafers. The cross section of these metallization layers 5 is determined primarily by the current carrying capability and area, of the intended semiconductor wafers and to some extent by the desired position of the connecting leads of the desired electrical arrangement, the position of the recesses 2 and the dimensions of the overall structural device.

The recesses 2 must be sufficiently wide so as to be able to receive the corresponding semiconductor wafer and thus, the width of the recesses 2 is dependent upon the thickness of the intended semiconductor wafers. Since the contact electrodes **3*b* of the semiconductor wafers border the respectively associated metallization layers 5 and are preferably connected therewith by soldering, the layers 5 must be relatively close to the contact surfaces of the semiconductor wafer so as to assure perfect solder bridges between the metallization layers and the associated contact electrodes; the width of the recesses 2**, therefore, must be selected so as to take this factor into account.

The carrier plate 1 may be made of a plastic material, such as that used for producing circuit boards for printed circuits. The carrier plate is then advisably made as thin as possible in dependence upon manufacturing conditions. The metal contacts 5 can then preferably be provided by conductive copper paths on the planar surface of the carrier plate. These conductive paths may be applied either on one side of the carrier plate 1 or identical paths can be provided on both sides thereof.

In addition, it is possible to extend the metallization layer 5 along the inner surfaces of the recesses 2 which are associated with the contact electrodes 3*b* of the semiconductor wafers. The requirement that it must be possible to produce an effective solder bridge between the contact electrodes of the inserted semiconductor wafer and the metallization layer also applies in this embodiment where the metallization layer extends along the inner surfaces of the recesses 2. In practice it has been found that it is still possible to produce such a solder bridge if the surface of the semiconductor wafer is spaced from the inner surface of the recess or from the adjacent edge of the metallization by a distance of approximately 0.3 mm.

It is also possible in accordance with the present invention, to utilize a ceramic material for the carrier plate 1. Preferably an oxide ceramic is used since such a ceramic is additionally suited to absorb and dissipate excess heat produced in the semiconductor wafers during the operation of the arrangement. If a ceramic material is utilized then the carrier plate is made thicker than it would be when using a carrier in the form of a circuit board.

Referring to FIG. 2, the structure of a semiconductor wafer intended for semiconductor arrangements according to the present invention is a sandwich-type structure which includes a silicon rectifier wafer 3*a* and a circular metal contact electrode 3*b* fastened to each of its two sides. In addition to serving as contact electrodes, the contacts 3*b* mechanically protect the wafer 3*a* and increase the heat capacity of the device. The contact electrodes 3*b* have a larger diameter than the silicon wafer 3*a*. At the remaining free surface, i.e. at its peripheral surface, the semiconductor wafer 3*a* is provided with an elastic protective lacquer coating 4 which also covers at least the adjacent edges of the contact electrodes. A rubber material in a dispersion or solution with a low surface tension can be utilized for this protective coating 4 and would be applied in a known manner. The protective coating 4 firmly encloses the semiconductor wafer in the form of a ring and simultaneously serves to stabilize its peripheral surface.

The recesses 2 in carrier plate 1 may have different configurations depending on the intended insertion depth for the semiconductor wafers 3. Furthermore, the end surfaces 2*a* of the recesses 2 can be rounded or made polygonal in order to adapt them to the edge profile of the corresponding semiconductor wafers. Such embodiments are especially desirable for plastic carrier plates.

When a plastic carrier plate such as a circuit board is utilized, the metallization layers 5 which are disposed on one or on both sides of the plate may be larger than required for current conduction so that they contribute to an improvement of the thermal operating behavior of the semiconductor rectifier arrangements.

Figure 3:
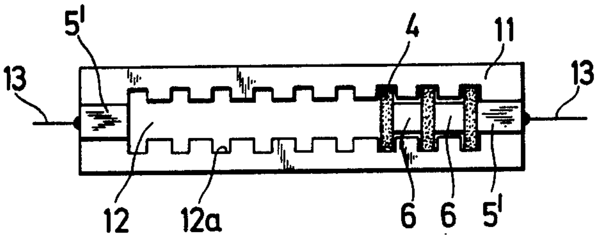
FIG. 3 is a plan view of a semiconductor rectifier arrangement according to a modified embodiment of the present invention.

FIG. 3 shows a modified embodiment of the present invention of an arrangement for producing a series connected electric circuit. The elongate carrier plate 11 is provided with a plurality of slit-shaped recesses 12*a* which are successively arranged along and transverse to the longitudinal axis of the plate 11 and are interconnected by an elongated recess 12, which extends along the longitudinal axis of the carrier plate. The recesses 12*a* are preferably arranged at identical intervals along the recess 12 and are also centered about this recess 12 so as to accommodate the semiconductor wafers by way of insertion.

With the aid of the protective elastic coating 4, the individual semiconductor wafers 3 are fixed or held at the surfaces of recesses 12*a* which extend parallel to the longitudinal axis of the carrier plate. The semiconductor wafers, which are aligned with the same electrical orientation, are mutually contacted, as shown in FIG. 3 for three individual elements, by means of a bar 6 of soldering material arranged between two adjacent elements and extending from the contact electrode of the one element to the oppositely disposed contact electrode of the other element. The bars 6 are preferably produced by an immersion soldering process. The connection between the outermost elements of the chain of elements produced in this manner with the connecting leads 13 is provided by the two metallization layers 5' which are provided between the last element at each end and the end of the carrier plate.

Figure 4:
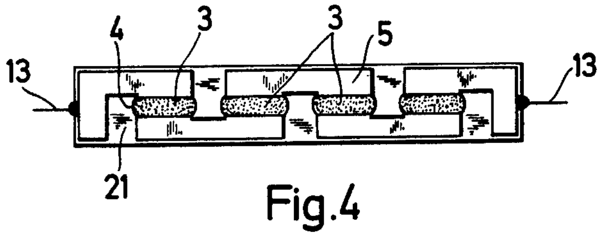
FIG. 4 is a plan view of a semiconductor rectifier arrangement according to another modified embodiment of the present invention.

Another modified embodiment of the present invention for an electrical series circuit arrangement is shown in FIG. 4. A strip-shaped carrier plate 21 is provided with recesses 2 which are aligned in a row such that their longitudinal axis coincides, for example, with the longitudinal axis of the carrier plate. The semiconductor wafers 3 are disposed within the recesses 2 and are arranged in alternatingly opposite electrical orientation. In the same manner as described above, the semiconductor wafers 3 are held in place within the corresponding recesses 2 by the protective coatings 4. The interconnection between the semiconductor wafers are again effected by metallization layers 5 which in order to produce a series circuit, extend in the form of meanders on one or both sides of the carrier plate 21. At both ends of the carrier plate, a connecting lead 13 is connected with the outermost sections of the metallization layers 5 by soldering.

It should be noted that semiconductor arrangements according to the present invention are not limited to the rectifier circuits illustrated but can also be utilized in other desired electrical arrangements.

In producing the semiconductor arrangements according to the present invention such as the embodiment shown in FIG. 4, where a carrier plate 21 is provided with semiconductor wafers 3, the plate 21 is attached, for example, to a device which permits insertion of the wafers until their abutment.

If wire-type external connecting leads are to be utilized, the carrier plate may be provided with a bore at each one of its end sections for accommodating a piece of wire. Thereafter all contacts of the structure formed in this way are produced by immersion soldering. By inserting this arrangement into a ceramic tube wherein it is embedded in a filler material a high voltage rectifier can thereby be produced. The production of high voltage rectifiers can be further simplified in that a plurality of the strip-shaped carrier plates is provided, with semiconductor wafers, and contacted over an optimum length and then arrangements having the desired reverse voltage carrying capability can be severed at the appropriate lengths.

The semiconductor arrangements of the present invention are advantageous in that they avoid the need for special instruments to align and fix the semiconductor wafers within the carrier plates. Additionally, semiconductor wafers without connecting leads can be used in a surprisingly simple manner since semiconductor arrangements with the desired electrical connections can be realized by the appropriate arrangement of metallization layers on a carrier plate.

It will be understood that the above description of the present invention is susceptible to various modifications, changes and adaptations, and the same are intended to be comprehended within the meaning and range of equivalents of the appended claims.

I claim:

1. In a semiconductor arrangement including at least one semiconductor wafer, a carrier plate of insulating material for supporting the semiconductor wafer and metal contacts for connecting the semiconductor wafer in a desired electrical arrangement, the improvement wherein: said carrier plate has at least one slit-shaped recess; said semiconductor wafer has a solderable contact electrode on each of its major surfaces and an elastic protective lacquer coating around its peripheral surface for stabilizing such surface; said semiconductor wafer is arranged within said recess such that its major surfaces intersect the plane of said carrier plate and the protective coating of said semiconductor wafer contacts the end surfaces of said recess so as to hold said semiconductor wafer in place; and said metal contacts are metal layers which lie parallel to the planar surface of said carrier plate and which border the longitudinal edges of said recess.

2. A semiconductor arrangement as defined in claim 1 wherein said carrier plate has a plurality of said recesses; there are a plurality of said semiconductor wafers, each arranged within a corresponding one of said recesses; and said metal contacts electrically connect all of said semiconductor wafers in the desired electrical arrangement.

3. A semiconductor arrangement as defined in claim 2 wherein said recesses are successively arranged along and transverse to a common longitudinal axis of said carrier plate; a further recess extending along said longitudinal axis interconnecting said slit-shaped recesses; and said metal contacts which are between the successive said semiconductor wafers are metal solder bars produced by immersion soldering.

4. A semiconductor arrangement as defined in claim 1 wherein said carrier plate is made of a synthetic material and said metal contacts are formed by metallization of copper on the planar surface of said carrier plate.

5. A semiconductor arrangement as defined in claim 1 wherein said carrier plate is made of a ceramic material.

6. A semiconductor arrangement as defined in claim 5 wherein said recess passes through said carrier plate.

7. A semiconductor arrangement as defined in claim 1 wherein said at least one recess is closed at both of its ends.

8. A semiconductor arrangement as defined in claim 1 wherein said semiconductor wafers are semiconductor rectifiers.

9. A semiconductor arrangement as defined in claim 2 wherein: each of said semiconductor arrangements is a semiconductor rectifier; and said metal contacts connect said rectifiers in series.

* * * * *